United States Patent
Fox et al.

(10) Patent No.: US 9,476,926 B2
(45) Date of Patent: Oct. 25, 2016

(54) REAL TIME ELECTROSTATIC DISCHARGE (ESD) DETECTION

(71) Applicant: HGST Netherlands B.V., Amsterdam (NL)

(72) Inventors: Ciaran A. Fox, Sunnyvale, CA (US); Ma. V. C. Maceren, Cagayan de Oro (PH); Ray N. M. Tag-at, Pulong Sta. Cruz (PH)

(73) Assignee: HGST Netherlands B.V., Amsterdam (NL)

( * ) Notice: Subject to any disclaimer, the term of this patent is extended or adjusted under 35 U.S.C. 154(b) by 686 days.

(21) Appl. No.: 13/915,581

(22) Filed: Jun. 11, 2013

(65) Prior Publication Data

US 2014/0236504 A1    Aug. 21, 2014

Related U.S. Application Data (60) Provisional application No. 61/767,686, filed on Feb. 21, 2013.

(51) Int. Cl.
| | |
|---|---|
| *G01R 31/02* | (2006.01) |
| *G01R 33/12* | (2006.01) |
| *G01R 31/00* | (2006.01) |
| *G11B 5/455* | (2006.01) |

(52) U.S. Cl.
CPC .......... *G01R 31/001* (2013.01); *G01R 31/025* (2013.01); *G11B 5/455* (2013.01)

(58) Field of Classification Search
CPC .. G01R 31/001; G01R 31/02; G01R 31/025; G06F 11/2221; G11B 5/455

USPC .......... 702/58, 59, 118, 121, 108, 115, 189; 324/210, 212, 754.03; 360/319; 451/5; 73/856

See application file for complete search history.

(56) References Cited

U.S. PATENT DOCUMENTS

| | | |
|---|---|---|
| 6,265,885 B1 | 7/2001 | Luo et al. |
| 6,635,931 B1 | 10/2003 | Wang |
| 7,049,809 B2 * | 5/2006 | Luo .......... G11B 5/102 324/210 |

(Continued)

FOREIGN PATENT DOCUMENTS

JP    2010251669 A    11/2010

OTHER PUBLICATIONS

Chun, Jung-Hoon, "ESD Protection Circuits for Advanced CMOS Technologies," A Dissertation, Department of Electrical Engineering, Stanford University, Jun. 2006, pp. 1-137.

(Continued)

*Primary Examiner* — John H Le
(74) *Attorney, Agent, or Firm* — Zilka-Kotab, PC (57) ABSTRACT

In one embodiment, a method for determining electrostatic discharge (ESD) includes building a slider delta comparison map using slider electrical and/or row bar quasi testing results, wherein row bar quasi testing is performed on row bars of multiple sliders, and wherein slider electrical testing is performed on individual sliders, determining whether a test device in a parent job passes primary ESD delta criteria, when the test device fails the primary ESD delta criteria: flagging the parent job of the test device as a reroute job and performing automatic actual parts rerouting for any jobs related to the parent job to pull parts from a test bin as opposed to a supply bin, wherein all parts pulled from the test bin are tested prior to assembly as opposed to parts pulled from the supply bin which are not 100% tested.

20 Claims, 6 Drawing Sheets

(56) References Cited

U.S. PATENT DOCUMENTS

| | | | |
|---|---|---|---|
| 7,165,462 B2 * | 1/2007 | Luo | G11B 5/3166 324/212 |
| 7,170,135 B2 | 1/2007 | Zecri et al. | |
| 7,274,047 B2 | 9/2007 | Russ et al. | |
| 2011/0216459 A1 | 9/2011 | Ritter et al. | |
| 2012/0074458 A1 | 3/2012 | Denison et al. | |

OTHER PUBLICATIONS

Ward, Scott T., "Electrostatic Discharge (ESD) Protection in CMOS," A Thesis, Department of Electrical Engineering, Idaho University, Dec. 2002, pp. 1-113.

"System-Level ESD/EMI Protection Guide," Texas Instruments, 2010, www.ti.com/esd, pp. 1-25.

\* cited by examiner

REAL TIME ELECTROSTATIC DISCHARGE (ESD) DETECTION

RELATED APPLICATIONS

This application claims priority to U.S. Provisional Patent Appl. No. 61/767,686, filed Feb. 21, 2013, which is herein incorporated by reference.

FIELD OF THE INVENTION

The present invention relates to data storage systems, and more particularly, this invention relates to detecting electrostatic discharge (ESD) events in real time to protect sensitive elements within electronic devices.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

The volume of information processing in the information age is increasing rapidly. In particular, it is desired that HDDs be able to store more information in their limited area and volume. A technical approach to this desire is to increase the capacity by increasing the recording density of the HDD. To achieve higher recording density, further miniaturization of recording bits is effective, which in turn typically requires the design of smaller and smaller components. These smaller and smaller components, however, are becoming more and more susceptible to ESD events, which can damage these components, such that the performance of these components is harmed and/or the components are rendered unusable.

SUMMARY

In one embodiment, a system includes a processor and logic integrated with and/or executable by the processor, the logic being adapted to: build a slider delta comparison map using slider electrical and/or row bar quasi testing results, wherein row bar quasi testing is performed on row bars of multiple sliders, and wherein slider electrical testing is performed on individual sliders, determine whether a test device in a parent job passes primary electrostatic discharge (ESD) delta criteria, and flag the parent job of the test device as a reroute job and perform automatic actual parts rerouting for any jobs related to the parent job to pull parts from a test bin as opposed to a supply bin when the test device fails the primary ESD delta criteria.

In another embodiment, a method for determining ESD includes building a slider delta comparison map using slider electrical and/or row bar quasi testing results, wherein row bar quasi testing is performed on row bars of multiple sliders, and wherein slider electrical testing is performed on individual sliders, determining whether a test device in a parent job passes primary ESD delta criteria, when the test device fails the primary ESD delta criteria: flagging the parent job of the test device as a reroute job and performing automatic actual parts rerouting for any jobs related to the parent job to pull parts from a test bin as opposed to a supply bin, wherein all parts pulled from the test bin are tested prior to assembly as opposed to parts pulled from the supply bin which are not 100% tested.

In yet another embodiment, a computer program product for determining ESD includes a computer readable storage medium having program code embodied therewith, the program code readable/executable by a processor to: receive, using the processor, results from slider electrical and/or row bar quasi testing, wherein row bar quasi testing is performed on row bars of multiple sliders, and wherein slider electrical testing is performed on individual sliders and includes slider-level dynamic electrical testing (SDET); build, using the processor, a slider delta comparison map using results of the slider electrical and/or row bar quasi testing, wherein the slider delta comparison map includes a visual representation of the slider electrical and/or row bar quasi testing results for a parent job to allow for pattern recognition of ESD problems; determine, using the processor, whether a test device in the parent job passes primary ESD delta criteria; when the test device fails the primary ESD delta criteria: flag, using the processor, the parent job of the test device as a reroute job; perform, using the processor, automatic actual parts rerouting for any jobs related to the parent job to pull parts from a test bin as opposed to a supply bin, wherein all parts pulled from the test bin are tested prior to assembly as opposed to parts pulled from the supply bin which are not 100% tested; create an automated report that includes any relevant information regarding the failed test device; send the automated report to an ESD team disposed to handle such reports; and store the automated report and any relevant information regarding the test device; when the test device passes the primary ESD delta criteria: determine whether the test device passes secondary ESD delta criteria that is different than the primary ESD delta criteria; and when the device fails the secondary ESD delta criteria: flag the parent job of the device as an alert job; create the automated report that includes any relevant information regarding the failed test device; send the automated report to an ESD team disposed to handle such reports; and store the automated report and any relevant information regarding the test device.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

In one general embodiment, a system includes a processor and logic integrated with and/or executable by the processor, the logic being adapted to: build a slider delta comparison map using slider electrical and/or row bar quasi testing results, wherein row bar quasi testing is performed on row bars of multiple sliders, and wherein slider electrical testing is performed on individual sliders, determine whether a test device in a parent job passes primary electrostatic discharge (ESD) delta criteria, and flag the parent job of the test device as a reroute job and perform automatic actual parts rerouting for any jobs related to the parent job to pull parts from a test bin as opposed to a supply bin when the test device fails the primary ESD delta criteria.

In another general embodiment, a method for determining ESD includes building a slider delta comparison map using slider electrical and/or row bar quasi testing results, wherein row bar quasi testing is performed on row bars of multiple sliders, and wherein slider electrical testing is performed on individual sliders, determining whether a test device in a parent job passes primary ESD delta criteria, when the test device fails the primary ESD delta criteria: flagging the parent job of the test device as a reroute job and performing automatic actual parts rerouting for any jobs related to the parent job to pull parts from a test bin as opposed to a supply bin, wherein all parts pulled from the test bin are tested prior to assembly as opposed to parts pulled from the supply bin which are not 100% tested.

In yet another general embodiment, a computer program product for determining ESD includes a computer readable storage medium having program code embodied therewith, the program code readable/executable by a processor to: receive, using the processor, results from slider electrical and/or row bar quasi testing, wherein row bar quasi testing is performed on row bars of multiple sliders, and wherein slider electrical testing is performed on individual sliders and includes slider-level dynamic electrical testing (SDET); build, using the processor, a slider delta comparison map using results of the slider electrical and/or row bar quasi testing, wherein the slider delta comparison map includes a visual representation of the slider electrical and/or row bar quasi testing results for a parent job to allow for pattern recognition of ESD problems; determine, using the processor, whether a test device in the parent job passes primary ESD delta criteria; when the test device fails the primary ESD delta criteria: flag, using the processor, the parent job of the test device as a reroute job; perform, using the processor, automatic actual parts rerouting for any jobs related to the parent job to pull parts from a test bin as opposed to a supply bin, wherein all parts pulled from the test bin are tested prior to assembly as opposed to parts pulled from the supply bin which are not 100% tested; create an automated report that includes any relevant information regarding the failed test device; send the automated report to an ESD team disposed to handle such reports; and store the automated report and any relevant information regarding the test device; when the test device passes the primary ESD delta criteria: determine whether the test device passes secondary ESD delta criteria that is different than the primary ESD delta criteria; and when the device fails the secondary ESD delta criteria: flag the parent job of the device as an alert job; create the automated report that includes any relevant information regarding the failed test device; send the automated report to an ESD team disposed to handle such reports; and store the automated report and any relevant information regarding the test device.

Figure 1:
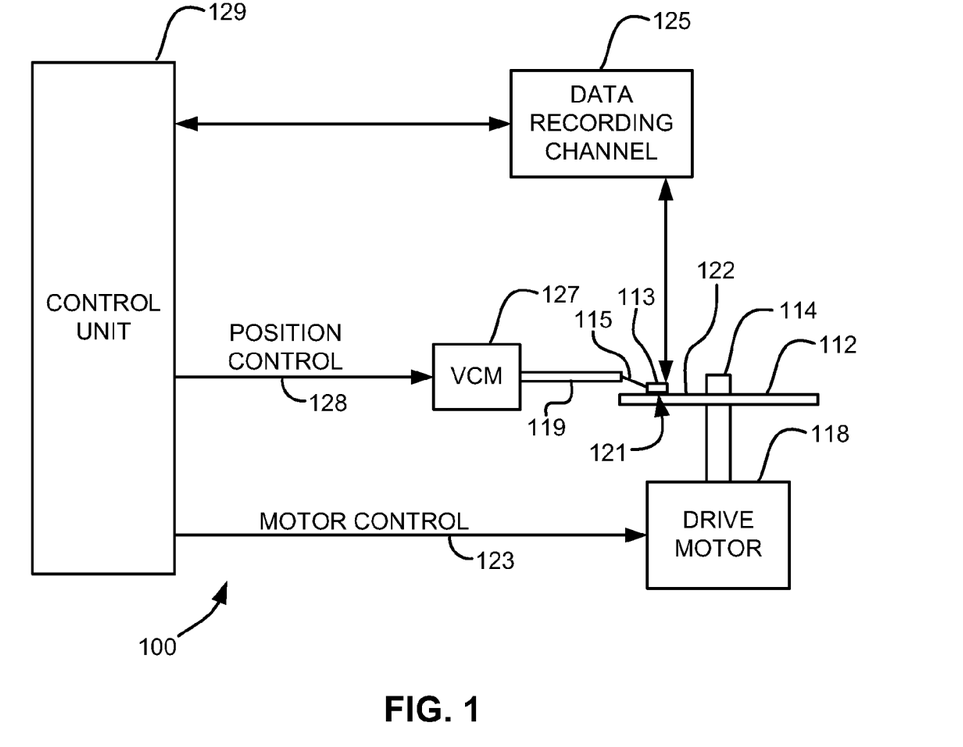
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic disk 112 is supported on a spindle 114 and rotated by a drive mechanism, which may include a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by controller 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the coil layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

Figure 2A:
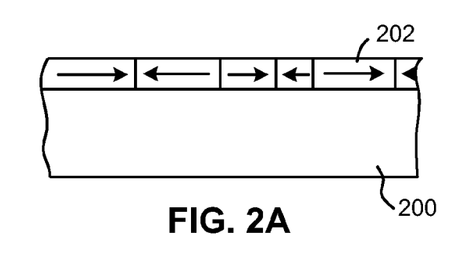
FIG. 2A is a schematic representation in section of a recording medium utilizing a longitudinal recording format.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

Figure 2B:
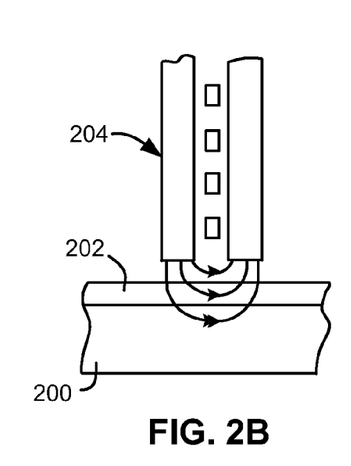
FIG. 2B is a schematic representation of a conventional magnetic recording head and recording medium combination for longitudinal recording as in FIG. 2A.

FIG. 2B shows the operative relationship between a conventional recording/playback head 204, which may preferably be a thin film head, and a conventional recording medium, such as that of FIG. 2A.

Figure 2C:
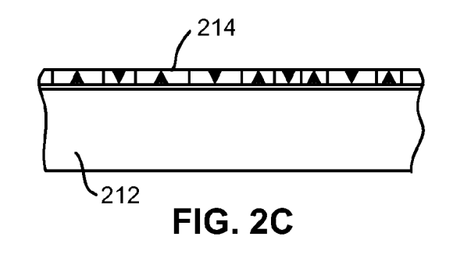
FIG. 2C is a magnetic recording medium utilizing a perpendicular recording format.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

Figure 2D:
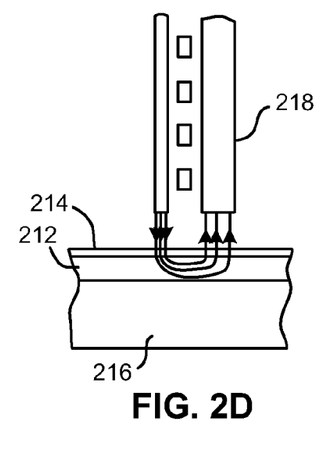
FIG. 2D is a schematic representation of a recording head and recording medium combination for perpendicular recording on one side.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

Figure 2E:
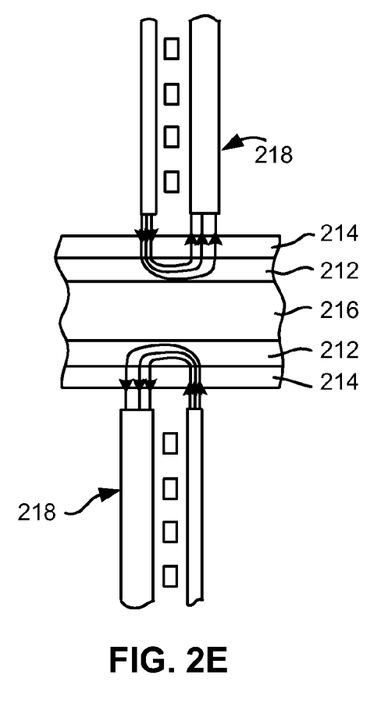
FIG. 2E is a schematic representation of a recording apparatus adapted for recording separately on both sides of the medium.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

Figure 3A:
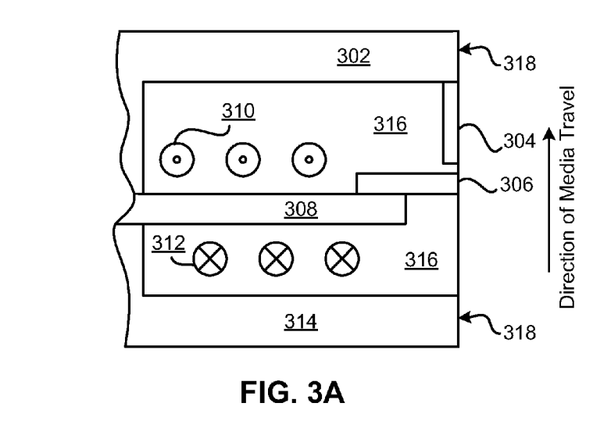
FIG. 3A is a cross-sectional view of one particular embodiment of a perpendicular magnetic head with helical coils.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

Figure 3B:
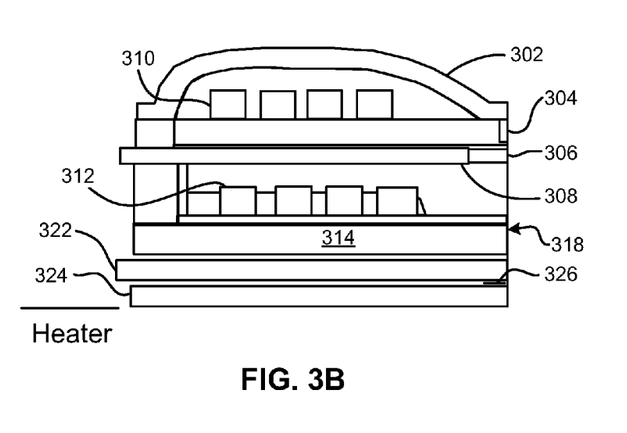
FIG. 3B is a cross-sectional view of one particular embodiment of a piggyback magnetic head with helical coils.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

Figure 4A:
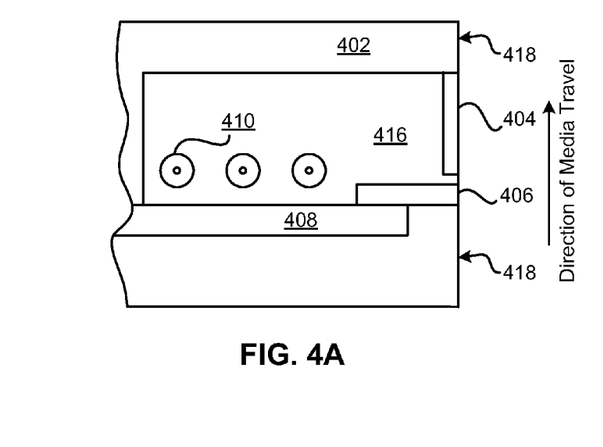
FIG. 4A is a cross-sectional view of one particular embodiment of a perpendicular magnetic head with looped coils.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

Figure 4B:
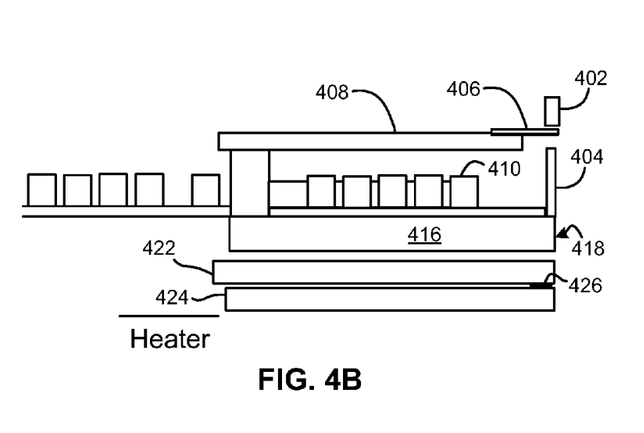
FIG. 4B is a cross-sectional view of one particular embodiment of a piggyback magnetic head with looped coils.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown near the non-ABS side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

Real time identification of ESD allows for tools to be fixed before they inadvertently damage production for days or even weeks, depending on the testing cycle used. This ESD damage may prove to be very costly, as the products which are manufactured after the occurrence of ESD may all be affected by the damage. The current cycle time between determination of an ESD mechanism and tool type is based on post-Out-of-Box (OBA) paper analysis and quasi-analysis. The ESD mechanism may be any cause, source, reason, and/or apparatus which is causing, has caused, or will cause ESD. The ESD mechanism may be determinative of the tool type that causes the issue, but is not always so. The tool type may be any operation, step, tool, and/or apparatus which is directly or indirectly involved with, the source of, and/or a contributor to the ESD.

A typical cycle time for OBA is a minimum of two days to a maximum of several weeks, depending on the depth of analysis. Also, the results obtained currently do not make use of slider-level dynamic electrical test (SDET) results and require more time from a user, such as an ESD engineer, ESD team, etc., thereby costing valuable time. There are other possible alternatives that have been considered, but the drawbacks outweigh the benefits, as shown in Table 1, where a real time ESD tool shows the best qualitative opportunity in measurement attributes, where comparatively, a rating of 1 is assigned to the best of the five shown options while a rating of 5 is assigned to the worst of the five shown options (1=good, 5=bad).

For sake of the descriptions in Table 1, Real Time analysis includes the methods and approaches described herein, according to various embodiments; slider-level Quasi Test (SQT) vs. Process Step is an analysis method where, in between each step, a testing step is added to test a certain percentage of the sliders; 100% Slider Quasi-Skip dynamic electrical test (DET) Sliders is an analysis method where Jade, Deco, etc., type testers are used to test every slider after every processing step; and no change indicates performing testing as is currently done (e.g., after manufacturing is complete).

As can be seen by the totals, where less is more desired, the Real Time analysis should be most efficient and value-oriented, based on all the criteria reviewed, which include customer satisfaction (CSAT), return on investment (ROI), cycle time, capital investment required, and various yields, among others.

The only categories where Real Time analysis may lag behind some of the other techniques is in head gimbal assembly (HGA) DET yield and skip DET yield, due to the testing steps inherent in the Real Time analysis; however, SDET yield does rank highly among the other options.

TABLE 1

|  | Real Time | SQT v. Process Step | 100% Slider Quasi-Skip DET Sliders | No Change |
|---|---|---|---|---|
| CSAT | 3 | 4 | 1 | 5 |
| HICAP OBA DPPM | 3 | 4 | 1 | 5 |
| HSA DPPM | 3 | 4 | 1 | 5 |
| HDD Instability Failure Ratio | 2 | 4 | 3 | 5 |
| HDD ORT Instability Failure Ratio | 2 | 4 | 3 | 5 |
| Quality Excursions | 2 | 4 | 3 | 5 |
| SDET Yield | 2 | 4 | 3 | 5 |
| HGA DET Yield | 4 | 3 | 1 | 5 |
| Skip DET Ratio | 5 | 3 | 4 | 1 |
| Inventory | 2 | 3 | 4 | 1 |
| Cycle Time | 2 | 3 | 4 | 1 |
| Capital Investment | 2 | 3 | 4 | 1 |
| ROI | 2 | 4 | 5 | 1 |
| Extendability (Low RA, TMR, CPP, GMR, etc.) | 1 | 2 | 3 | 4 |
| IP | 1 | 3 | 2 | 5 |
| Total | 35 | 52 | 42 | 54 |

Also, another advantage of the systems and methods described herein according to various embodiments is that they do not require any tool budget expense, unlike the conventional alternatives, as shown in Table 2.

TABLE 2

|  | Real Time | SQT v. Process Step | 100% Slider Quasi-Skip DET Sliders | No Change |
|---|---|---|---|---|
| Additional Deco Tool Requirement | No | Yes | Yes | No |
| Exemplary Tool Expense | $0K USD | ~$5M USD (@10% Sampling) | ~$44M USD (@100% Sampling) | $0K USD |

Pattern recognition is essential for proper implementation of the methods and systems described herein. The delta of the measurement values between Row Bar Quasi and SDET processes, according to one embodiment, are mapped by the system so that a user, such as one or more ESD engineers, may easily perceive patterns that are related to a high possibility of a certain ESD mechanism and/or related tools causing the ESD. And by adding tool information, the user is able to pinpoint both mechanism and tool that led to the observed ESD.

Figure 5:
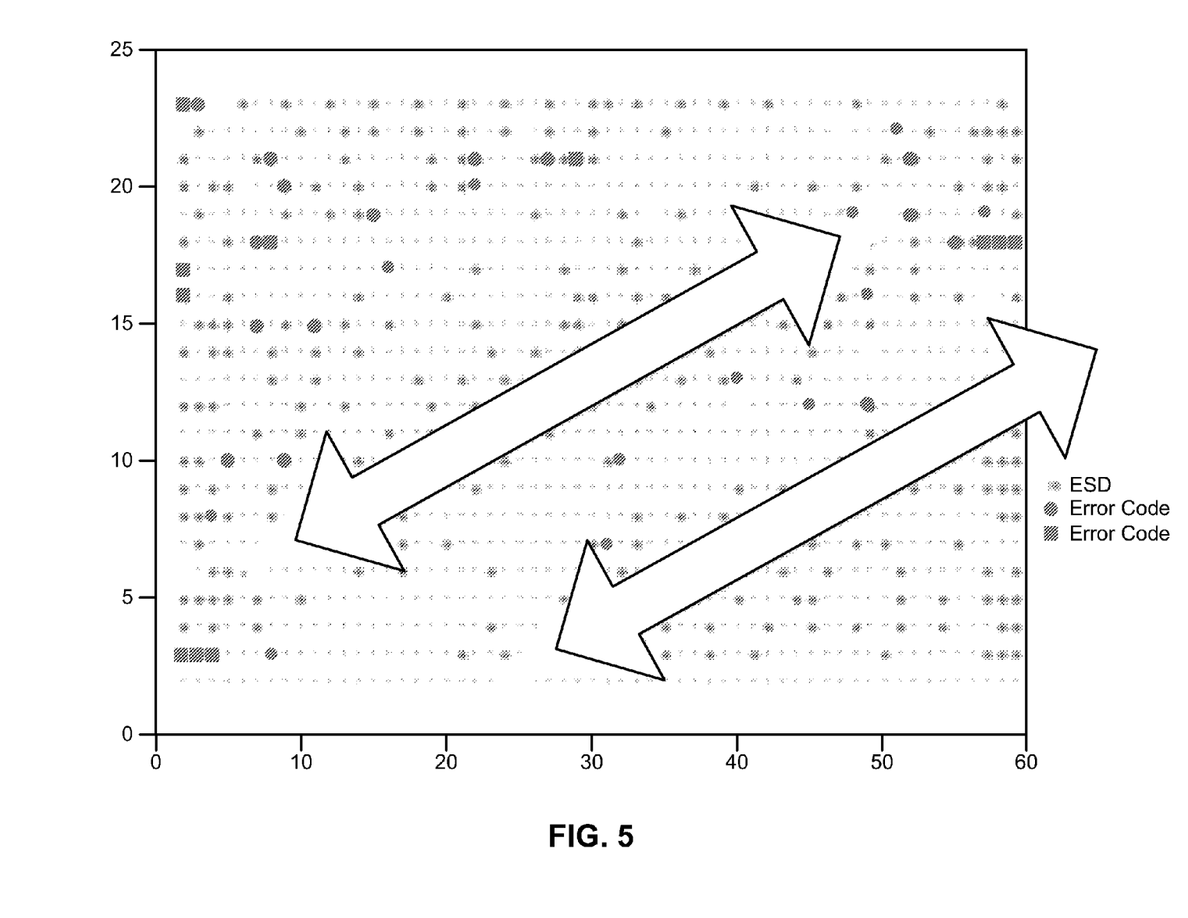
FIG. 5 shows a delta mapping for an exemplary set of tested devices.

FIG. 5 shows a delta mapping for an exemplary set of tested devices. Evident in this delta mapping are striation patterns which suggest an ESD mechanism, according to one example. Real-time identification of ESD occurrence and mechanism in Fab2 is an opportunity to both reduce costs and improve user satisfaction. Reduced costs are achieved by improving SDET, HGA, HSA (for skip DET heads), and HDD Yields. Improved user satisfaction is achieved by reducing ESD escapes and potential instability in HDDs.

As a synopsis, a job-based ESD parametric criteria is applied on the delta of row bar quasi and slider DET measurement data on all jobs immediately at post SDET. Failed jobs as per ESD criteria will cause its corresponding Skip DET parts to be rerouted to 100% measurement for screening. In parallel to this, the system will send a report which includes delta patterns, tool information, and other process traceability and dependency check items to the user.

Figure 6:
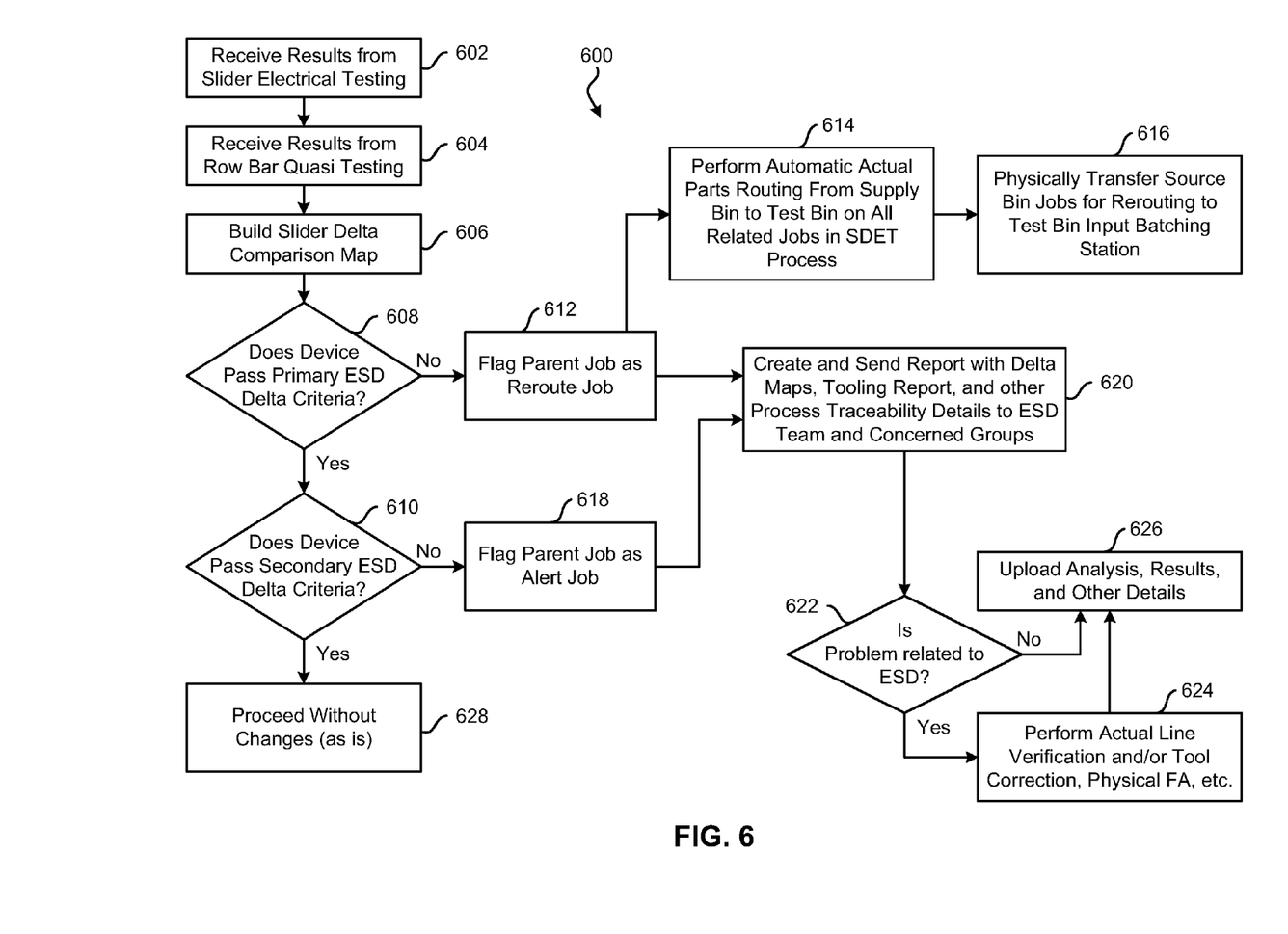
FIG. 6 shows a flowchart of a method, according to one embodiment.

Referring now to FIG. 6, a flowchart of a method 600 according to one embodiment is shown. As an option, the present method 600 may be implemented to test structures such as those shown in FIGS. 1-4B. Of course, however, this method 600 and others presented herein may be used to test any electronic and/or magnetic structures useful in or with a wide variety of devices and/or purposes which may or may not be related to magnetic recording. Further, the methods presented herein may be carried out in any desired environment. It should also be noted that any aforementioned features may be used in any of the embodiments described in accordance with the various methods.

In operation 602, results from slider electrical testing are received, such as with a processor, e.g., an integrated circuit (IC), an application specific integrated circuit (ASIC), a field programmable gate array (FPGA), a central processing unit (CPU), etc., computer, controller, or some other suitable computing system capable of interpreting the results. The type and/or duration of the slider electrical testing may vary, and in one embodiment, it may comprise slider-level dynamic electrical testing (SDET). In one embodiment, the SDET may test other aspects of performance on a range of devices from about 5% to 100%, such as about 50%, of the produced sliders on an individual basis. In more embodiments, the amount of produced sliders which are tested may vary from about 5% to 100%, depending on desired testing level, manufacturing conditions, an amount of detected errors in previously tested sliders, etc. This testing may be used to determine patterns associated with specific, measurable ESD events of certain types, caused by certain factors, like tool failure, contamination, etc.

In one approach, 100% post measurement testing may be used to achieve feedback to identify ESD issues in real time which allows for tools which may be causing the ESD to be identified and fixed or replaced. 100% post measurement is much more costly than a normal production would allow for, but it may be used in initial processing to further improve yield thereafter.

In operation 604, results from row bar quasi testing are received, such as with a processor, computer, controller, or some other suitable computing system capable of interpreting the results. In this testing, the analysis is performed on row bars instead of on sliders, and therefore another step in the process may be investigated as for sources/causes of ESD.

In operation 606, a slider delta comparison map is built using slider electrical and/or row bar quasi testing results. This comparison map may be used to determine a cause/source/tool that directly or indirectly leads to an observed ESD event. The delta comparison map may comprise data for randomized rows of sliders, such that an x-y plot of the data may provide a visual indication of any patterns in ESD events which may provide information on what a cause/source of the ESD may be, in one approach.

The slider delta comparison map comprises a visual representation of the slider electrical and/or row bar quasi testing results for the parent job to enable pattern recognition of ESD problems, which may be due to any number of factors, such as row processing, slider cutting, polishing, etc.

In operation 608, it is determined whether the device under test passes a primary set of ESD delta criteria. This primary ESD delta criteria may be configured to set a threshold for devices which precedes a secondary set of criteria which may be a combination of criteria, row bases criteria, and nearest neighbor changes. If a job fails the primary ESD delta criteria, then the job and possibly other jobs containing devices nearby in the manufacturing line are not usable. When the job fails the primary ESD delta criteria, the method 600 continues to operation 612; otherwise, the method 600 continues to operation 610.

In one embodiment, the primary ESD delta criteria may comprise normalized resistance change being greater than or equal to a predetermined threshold amount, a percentage of parts from all parts having their normalized resistance change being greater than or equal to the predetermined threshold amount, normalized amplitude change being greater than or equal to a second predetermined threshold amount, a second percentage of parts having their normalized amplitude change being greater than or equal to the second predetermined threshold amount, normalized noise change being greater than or equal to a third predetermined threshold amount, a third percentage of parts having their normalized noise change being greater than or equal to the third predetermined threshold amount, or any other suitable criteria as would be known by one of skill in the art. In each of these embodiments, the thresholds may be chosen based on empirical results related to the measured value and measurement accuracy.

It is determined whether the test device in the parent job passes the primary ESD delta criteria after the slider electrical and/or row bar quasi testing and prior to using the test device or any other device in the parent job in further assembly. Particularly, it is beneficial to perform the delta map comparison as soon as possible after testing to ensure that the devices under test are not affected by ESD and suitable for use in electrical device assembly.

In operation 610, it is determined whether the device under test passes a secondary set of ESD delta criteria. This secondary ESD delta criteria may be configured to set a threshold for devices which requires different criteria than the primary ESD delta criteria. That is, the secondary ESD delta criteria may be different than the primary ESD delta criteria. If a device fails the secondary ESD delta criteria, then the device and possibly other devices nearby in the manufacturing line may not be usable or may be corrupt.

When the device fails the secondary ESD delta criteria, the method 600 continues to operation 618; otherwise, the method 600 continues to operation 628 where the manufacturing process continues uninterrupted because the device tested appropriately.

In one embodiment, the secondary ESD delta criteria may comprise one or more primary criterion combined together (combination criteria) and statements of primary criteria, one or more of the primary criteria applied on a per row basis (as opposed to a per job basis), nearest neighbor relative changes of primary criteria, or any other criteria which is capable of further defining the ability of the tested devices to perform properly once in use in the field, as would be known by one of skill in the art.

In operation 612, when the device fails the primary ESD delta criteria, as indicated in operation 608, the parent job which produced the device is flagged as a reroute job, so that all possibly affected devices and/or parts thereof are rerouted from the production line and set aside for further testing.

In operation 614, any jobs related to the parent job which produced the test device which failed at least one ESD delta criteria are automatically rerouted to pull parts from the test bin as opposed to the supply bin such that any affected jobs and/or parts needed for assembly in related jobs no longer pull from the supply chain without testing. Instead, the related jobs now pull parts from the test bin, where all parts are tested prior to assembly, because the devices and/or parts thereof may be unusable as intended due to the observed ESD damage on the test device. The supply bin (sometimes referred to as Bin S) is a cache of parts/devices which do not undergo testing during the assembly/manufacturing process. In contrast, any parts/devices taken from the test bin (sometimes referred to as Bin D) are tested prior to being incorporated and/or used to produce any further products, to ensure that the parts/devices have not sustained damage that makes them unusable or otherwise compromising to the products.

In operation 616, any jobs related to the test device according to the SDET process are physically transferred (presumably by an operator or some other suitable production personnel) from the supply bin to the test bin, for use in input batch station testing and assembly.

In operation 618, when the device fails the secondary ESD delta criteria, as indicated in operation 610, the parent job which produced the device is flagged as an alert job, indicating that there may be problems with this job associated with one or more ESD events.

In operation 620, when the device fails either the primary or secondary ESD delta criteria, an automated report is created that includes any relevant information regarding the failed test device. For example, the report may include one or more delta maps, tooling reports, details on any reroute jobs dispositioned within a time interval of the report, and other process traceability details. The report may be sent to one or more members of an ESD team disposed to handle such reports, such as via a set frequency.

In turn, the one or more ESD team members may check any ESD-related phenomenon, including but not limited to: 1) striation patterns indicated by the one or more delta maps; 2) a 1:1 plot of Resistance, Amplitude, Asymmetries, Noise, etc.; 3) anomalies in the tooling reports; and 4) other dependencies related to ESD as would be understood by one of skill in the art.

Furthermore, the automated report and any relevant information regarding the test device may be stored for use in future analysis and/or record keeping.

In operation 622, the automated report is analyzed to determine whether the test device experienced problems due to ESD.

In one approach, the one or more members of the ESD team determine whether the failed ESD delta criteria test is related to one or more ESD-related issues in the production process. When the failure is determined to be ESD-related, the method 600 continues to operation 626; otherwise, it continues to operation 624.

In operation 624, when the failed ESD delta criteria test is determined to be related to one or more ESD-related issues in the production process, an alert is sent to an ESD team to perform actual line verification and/or tool correction based on the automated report when it is determined that the test device experienced problems due to ESD.

In one approach, actual line verification of the production process and/or tool correction may be performed by a qualified operator. After the analysis/investigation, the method 600 continues to operation 626. During operation 624, it is hoped that the actual source/cause of the ESD-related issues may be determined, and possibly corrected and/or removed such that it does not affect any other devices.

Furthermore, one or more members of the ESD team and/or qualified operators may perform visual inspection of any tools related to the ESD, any parts used in the production, or any other possible sources of the ESD. In addition, in some instances as needed, physical FA may be performed to further refine the determination of the actual source/cause of the ESD which has caused the test device to fail one or more ESD-related tests. The physical FA may include taking any related parts from the production process and performing detailed analysis of the parts, such as via scanning electron microscopy (SEM), cross-sectional analysis, etc.

In operation 626, when the failed ESD delta criteria test is not related to one or more ESD-related issues in the production process, the analysis of this decision, results, and other details of the determination are uploaded and stored for future reference should the same or similar issues be encountered again.

Figure 7:
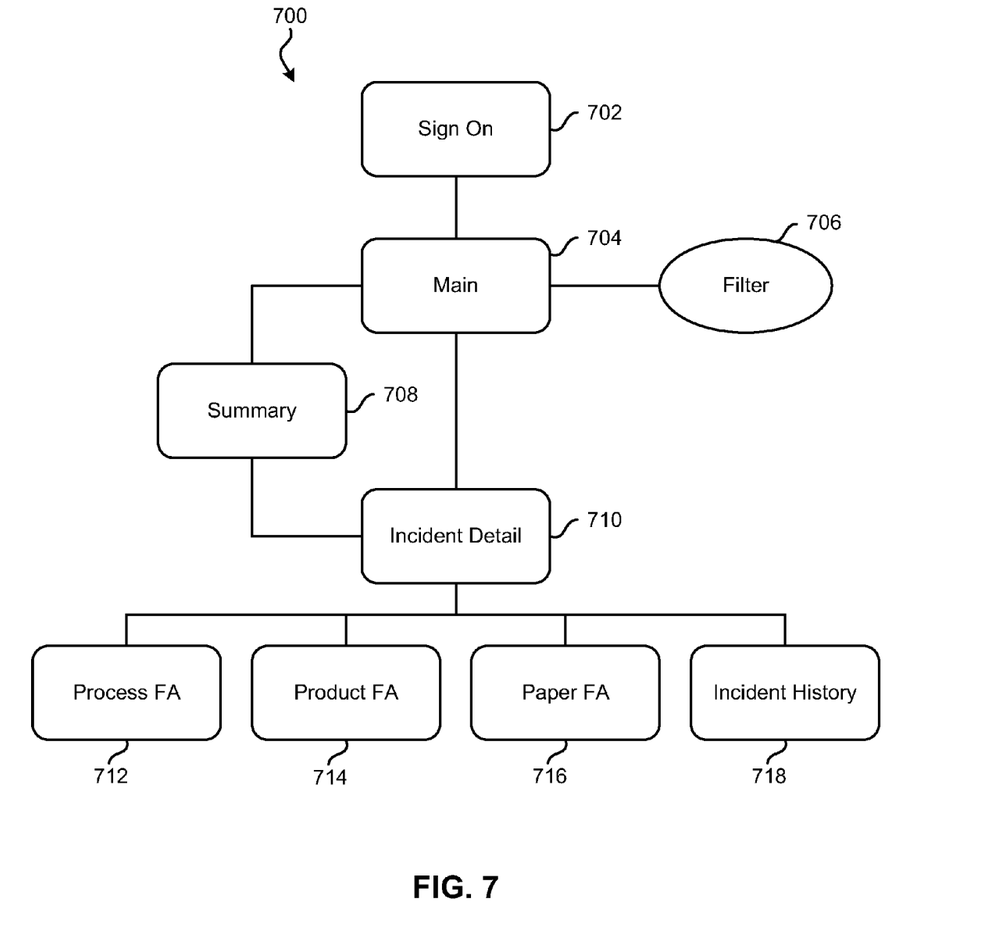
FIG. 7 shows a page map of an exemplary electrostatic discharge (ESD) testing application, according to one embodiment.

In order to provide support for the ESD testing described herein according to various embodiments, an ESD testing application may be provided. A page map 700 of an exemplary ESD testing application is shown in FIG. 7 according to one embodiment. The ESD testing application may be capable of being executed on any desired platform, including, but not limited to, MICROSOFT Windows, APPLE Mac OS, Linux, etc., and may be used as a plug-in and/or extension to existing manufacturing applications, as would be known by one of skill in the art.

According to the ESD testing application page map 700, a sign on page 702 or interface may be displayed and/or output to a user prior to the user being given access to other aspects of the testing application. This sign on page 702 may be not displayed if the testing application is executed on a secure workstation or for any other suitable reason, such as the testing application being accessed from within a secure computing environment. The main page 704 then provides an interface for the user to access the other functionality of the ESD testing application. In addition, a filter 706 may be used to filter certain characteristics and/or aspects, as would be understood by one of skill in the art.

From the main page 704, an incident detail report 710 and a summary 708 of the incident detail report 710 are accessible. The incident detail report 710 may include, but is not limited to showing, a Process Failure Analysis (FA) 712, a Product FA 714, a Paper FA 716, and/or an Incident History 718. Any of these reports and analysis may be used to determine a cause and/or tool related to the observed ESD, either automatically based on pattern recognition or by an ESD engineer or ESD team working together to determine source and resolution of the observed ESD, in various approaches.

It should be noted that methodology presented herein for at least some of the various embodiments may be implemented, in whole or in part, in computer hardware, software, by hand, using specialty equipment, etc. and combinations thereof.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising a processor and logic integrated with and/or executable by the processor, the logic being configured to cause the processor to:
   build a slider delta comparison map using slider electrical and/or row bar quasi testing results, wherein row bar quasi testing is performed on row bars of multiple sliders, wherein slider electrical testing is performed on individual sliders, and wherein the slider delta comparison map comprises a visual representation of the slider electrical and/or row bar quasi testing results for a parent job to allow for pattern recognition of electrostatic discharge (ESD) problems;
   determine whether a test device in a parent job passes primary (ESD) delta criteria;
   flag the parent job of the test device as a reroute job and perform automatic actual parts rerouting for any jobs related to the parent job to pull parts from a test bin as opposed to a supply bin when the test device fails the primary ESD delta criteria; and
   create an automated report that includes relevant information regarding the failed test device.

2. The system as recited in claim 1, wherein the logic is further configured to receive the results from slider electrical and/or row bar quasi testing, wherein the slider electrical testing comprises slider-level dynamic electrical testing (SDET), wherein slider electrical testing results comprise resistance values obtained after testers are used to test every slider after every processing step, and wherein row bar quasi testing results comprise resistance values obtained after testers are used to test a row bar after at least one processing step.

3. The system as recited in claim 1, wherein the logic is further configured to:
   send the automated report to an ESD team disposed to handle such reports; and
   store the automated report and any relevant information regarding the test device.

4. The system as recited in claim 3, wherein the logic is further configured to:
   analyze the automated report to determine whether the test device experienced problems due to ESD; and
   send an alert to an ESD team to perform actual line verification and/or tool correction based on the automated report when it is determined that the test device experienced problems due to ESD.

5. The system as recited in claim 1, wherein the logic is further configured to:
   determine whether the test device passes secondary ESD delta criteria that is different than the primary ESD delta criteria when the test device passes the primary ESD delta criteria; and
   flag the parent job of the device as an alert job when the device fails the secondary ESD delta criteria.

6. The system as recited in claim 5, wherein the logic is further configured to create an automated report that includes any relevant information regarding the failed test device, send the automated report to an ESD team disposed to handle such reports, and store the automated report and any relevant information regarding the test device when the device fails the secondary ESD delta criteria.

7. The system as recited in claim 6, wherein the logic is further configured to analyze the automated report to determine whether the test device experienced problems due to ESD and send an alert to an ESD team to perform actual line verification and/or tool correction based on the automated report when it is determined that the test device experienced problems due to ESD.

8. The system as recited in claim 1, wherein the primary ESD delta criteria is selected from a group consisting of: normalized resistance change being greater than or equal to a predetermined threshold amount, a percentage of parts from all parts having their normalized resistance change being greater than or equal to the predetermined threshold amount, normalized amplitude change being greater than or equal to a second predetermined threshold amount, a second percentage of parts having their normalized amplitude change being greater than or equal to the second predetermined threshold amount, normalized noise change being greater than or equal to a third predetermined threshold amount, or a third percentage of parts having their normalized noise change being greater than or equal to the third predetermined threshold amount.

9. The system as recited in claim 1, wherein it is determined whether the test device in the parent job passes the primary ESD delta criteria after the slider electrical and/or row bar quasi testing and prior to using the test device or any other device in the parent job in further assembly.

10. The system as recited in claim 1, wherein all parts pulled from the test bin are tested prior to assembly as opposed to parts pulled from the supply bin which are not 100% tested.

11. A method for determining electrostatic discharge (ESD), the method comprising:
    building a slider delta comparison map using slider electrical and/or row bar quasi testing results, wherein row bar quasi testing is performed on row bars of multiple sliders, and wherein slider electrical testing is performed on individual sliders;
    determining whether a test device in a parent job passes primary ESD delta criteria;
    when the test device fails the primary ESD delta criteria:
       flagging the parent job of the test device as a reroute job; and
       performing automatic actual parts rerouting for any jobs related to the parent job to pull parts from a test bin as opposed to a supply bin, wherein all parts pulled from the test bin are tested prior to assembly as opposed to parts pulled from the supply bin which are not 100% tested.

12. The method as recited in claim 11, further comprising receiving the results from slider electrical and/or row bar quasi testing, wherein the slider electrical testing comprises slider-level dynamic electrical testing (SDET).

13. The method as recited in claim 11, further comprising:
    creating an automated report that includes any relevant information regarding the failed test device;
    sending the automated report to an ESD team disposed to handle such reports; and
    storing the automated report and any relevant information regarding the test device.

14. The method as recited in claim 13, further comprising:
    analyzing the automated report to determine whether the test device experienced problems due to ESD; and
    sending an alert to an ESD team to perform actual line verification and/or tool correction based on the automated report when it is determined that the test device experienced problems due to ESD.

15. The method as recited in claim 11, further comprising:
when the test device passes the primary ESD delta criteria, determining whether the test device passes secondary ESD delta criteria that is different than the primary ESD delta criteria; and
when the device fails the secondary ESD delta criteria, flagging the parent job of the device as an alert job.

16. The method as recited in claim 15, further comprising, when the device fails the secondary ESD delta criteria:
creating an automated report that includes any relevant information regarding the failed test device;
sending the automated report to an ESD team disposed to handle such reports; and
storing the automated report and any relevant information regarding the test device.

17. The method as recited in claim 16, further comprising:
analyzing the automated report to determine whether the test device experienced problems due to ESD; and
sending an alert to an ESD team to perform actual line verification and/or tool correction based on the automated report when it is determined that the test device experienced problems due to ESD.

18. The method as recited in claim 11, wherein the slider delta comparison map comprises a visual representation of the slider electrical and/or row bar quasi testing results for the parent job to allow for pattern recognition of ESD problems.

19. The method as recited in claim 11, wherein it is determined whether the test device in the parent job passes the primary ESD delta criteria after the slider electrical and/or row bar quasi testing and prior to using the test device or any other device in the parent job in further assembly.

20. A computer program product for determining electrostatic discharge (ESD), the computer program product comprising a computer readable storage medium having program code embodied therewith, the program code readable/executable by a processor to:
receive, using the processor, results from slider electrical and/or row bar quasi testing, wherein row bar quasi testing is performed on row bars of multiple sliders, and wherein slider electrical testing is performed on individual sliders and comprises slider-level dynamic electrical testing (SDET);
build, using the processor, a slider delta comparison map using results of the slider electrical and/or row bar quasi testing, wherein the slider delta comparison map comprises a visual representation of the slider electrical and/or row bar quasi testing results for a parent job to allow for pattern recognition of ESD problems;
determine, using the processor, whether a test device in the parent job passes primary ESD delta criteria;
when the test device fails the primary ESD delta criteria:
flag, using the processor, the parent job of the test device as a reroute job;
perform, using the processor, automatic actual parts rerouting for any jobs related to the parent job to pull parts from a test bin as opposed to a supply bin, wherein all parts pulled from the test bin are tested prior to assembly as opposed to parts pulled from the supply bin which are not 100% tested;
create an automated report that includes any relevant information regarding the failed test device;
send the automated report to an ESD team disposed to handle such reports; and
store the automated report and any relevant information regarding the test device;
when the test device passes the primary ESD delta criteria:
determine whether the test device passes secondary ESD delta criteria that is different than the primary ESD delta criteria; and
when the device fails the secondary ESD delta criteria:
flag the parent job of the device as an alert job;
create the automated report that includes any relevant information regarding the failed test device;
send the automated report to an ESD team disposed to handle such reports; and
store the automated report and any relevant information regarding the test device.

\* \* \* \* \*

UNITED STATES PATENT AND TRADEMARK OFFICE
CERTIFICATE OF CORRECTION

PATENT NO. : 9,476,926 B2  
APPLICATION NO. : 13/915581  
DATED : October 25, 2016  
INVENTOR(S) : Ciaran A. Fox et al.

Page 1 of 1

It is certified that error appears in the above-identified patent and that said Letters Patent is hereby corrected as shown below:

In the Specification

Column 12, Line 13 please replace "some instances as" with --some instances and as--.

In the Claims

Column 13, Line 18 please replace "primary (ESD) delta" with --primary ESD delta--.

Signed and Sealed this  
Eighth Day of May, 2018

Andrei Iancu  
*Director of the United States Patent and Trademark Office*